United States Patent [19]
Rosenmayer

[11] Patent Number: 5,928,791
[45] Date of Patent: Jul. 27, 1999

[54] LOW DIELECTRIC CONSTANT MATERIAL WITH IMPROVED DIELECTRIC STRENGTH

[75] Inventor: C. Thomas Rosenmayer, Eau Claire, Wis.

[73] Assignee: W. L. Gore & Associates, Inc., Newark, Del.

[21] Appl. No.: 09/145,229

[22] Filed: Sep. 1, 1998

Related U.S. Application Data

[62] Division of application No. 08/834,796, Apr. 3, 1997, abandoned.

[51] Int. Cl.$^6$ .............................. B05D 5/12; B23B 27/00
[52] U.S. Cl. ............................................ 428/421; 428/422
[58] Field of Search ..................................... 428/421, 422

[56] References Cited

U.S. PATENT DOCUMENTS

| | | | |
|---|---|---|---|
| 3,373,076 | 3/1968 | Gosnell . | |
| 4,384,092 | 5/1983 | Blaise et al. .............................. | 526/225 |
| 4,849,284 | 7/1989 | Arthur et al. ............................ | 428/325 |
| 4,935,844 | 6/1990 | Burn ........................................ | 361/321 |
| 4,937,132 | 6/1990 | Gaku et al. .............................. | 428/209 |
| 5,034,801 | 7/1991 | Fischer ...................................... | 357/72 |
| 5,098,781 | 3/1992 | Minnick et al. ...................... | 428/313.5 |
| 5,117,272 | 5/1992 | Nomura et al. ........................... | 357/52 |
| 5,126,192 | 6/1992 | Chellis et al. ........................... | 428/323 |
| 5,260,119 | 11/1993 | Jean et al. ................................ | 428/210 |
| 5,283,081 | 2/1994 | Kata et al. ................................ | 427/96 |
| 5,292,927 | 3/1994 | Griffith et al. .......................... | 560/221 |
| 5,312,716 | 5/1994 | Unoki et al. ............................. | 430/313 |
| 5,324,813 | 6/1994 | Hougham et al. ..................... | 528/353 |
| 5,358,775 | 10/1994 | Horn, III ................................. | 428/209 |
| 5,359,767 | 11/1994 | Chen et al. ................................ | 29/830 |
| 5,362,550 | 11/1994 | Takeshita ................................. | 428/209 |
| 5,393,712 | 2/1995 | Rostoker et al. ....................... | 437/238 |
| 5,399,640 | 3/1995 | Hazelbeck ................................ | 526/214 |
| 5,402,003 | 3/1995 | McIver et al. ........................... | 257/668 |
| 5,403,900 | 4/1995 | Wu et al. .................................. | 526/214 |
| 5,405,677 | 4/1995 | Griffith et al. .......................... | 428/209 |
| 5,438,022 | 8/1995 | Allman et al. ........................... | 427/231 |
| 5,442,237 | 8/1995 | Hughes et al. ........................... | 257/759 |
| 5,449,427 | 9/1995 | Wojnarowski et al. ................. | 156/155 |
| 5,476,717 | 12/1995 | Floch ....................................... | 428/421 |
| 5,504,170 | 4/1996 | Wu ........................................... | 526/214 |
| 5,591,676 | 1/1997 | Hughes et al. ........................... | 437/195 |

FOREIGN PATENT DOCUMENTS

| | | |
|---|---|---|
| 769788 | 4/1997 | European Pat. Off. . |
| 7-168004 | 7/1995 | Japan . |

OTHER PUBLICATIONS

Kim et al, J. Appl. Phys. 67(1), pp. 251–254, Jan. 1990.
Sun et al, Mater. Res. Symp. Proc., pp. 85–90, #443, 1997.
Rosenmayer et al, Mater. Res. Symp. Proc., pp. 463–468, #427, 1996.
Low–Dielectric Constant Materials–Synthesis and Applications in Microelectronics–T.M. Lu, S.F. Murarka, T.S. Kuan, C.H. Ting–Vol. 381 (pp. 45–50), Mat. Res. Soc. Symp. Proc., 1995.
Adhesion Studies of Metals on Fluorocarbon Polymer Films–Chin–An Chang, Yong–Kil Kim, and A.G. Schrott–J. Vac. Sci. Technol. A, vol. 8, No. 4 Jul/Aug 1990 (pp.3304–3309).
Methods and Needs for Low K Material Research –Chiu H. Ting, Thomas E. Seidel – SEMATECH – Mat. Res. Soc. Symp. Proc. vol. 381–1995 Materials Research Society (pp.3–17).
Interconnect Metalization for Future Device Generations –Bruce Roberts, Alain Harrus, Robert L. Jackson –Feb. 1995 Solid State Technology (pp. 69–78).
29th Annual Proceedings Reliability Physics 1991 – IEEE Catalog No. 91 CH2974–4 (pp.52–56).

*Primary Examiner*—Erma Cameron
*Attorney, Agent, or Firm*—Victor M. Genco, Jr.

[57] ABSTRACT

The present invention relates to a method of rapidly cooling a sintered coherent film formed from PTFE, by quenching or other suitable cooling technique, which results in a PTFE film, that has improved dielectric properties, such as, increased breakdown voltage and lower current leakage, and the resulting article.

7 Claims, 3 Drawing Sheets

LOW DIELECTRIC CONSTANT MATERIAL WITH IMPROVED DIELECTRIC STRENGTH

RELATED APPLICATIONS

The present application is a divisional of U.S. patent application Ser. No. 08/834,796 filed on Apr. 3, 1997 now abandoned.

FIELD OF THE INVENTION

The present invention relates to a method for improving the dielectric strength of PTFE thin films by regulating the cooling rate of a sintered PTFE film, and the resulting article.

BACKGROUND OF THE INVENTION

Integrated circuits are created from a semiconductor wafer using various etching, doping, and depositing steps that are well known in the art of fabricating integrated circuit devices. The wafer may be comprised of a number of integrated circuit dies that each represent a single integrated circuit chip. Modern high-performance integrated circuits are comprised of millions of transistors that perform functions such as random access memory, central processing communications, etc. Each of these transistors must be interconnected with electrically-conducting elements. A typical modern integrated circuit now contains multiple layers of these conductor elements. Due to the size constraints of placing millions of conducting elements on a chip that has an area of only a few square centimeters, the connecting elements themselves have become very small, and the distance that separates conducting elements has shrunk as well. A state-of-the-art integrated circuit produced today has a conductor width of 0.25 microns and conductor spacing of 0.25 microns.

Because of the small spacing, many electrical performance problems are now arising in integrated circuits. The reduced spacing results in increased electrical capacitance, which causes capacitative interconnect delay and can slow down the operation speed of the circuit. Capacitance also causes cross-talk which can result in signal errors being generated if the problem is not solved. In addition, it is also desirable to reduce the capacitance in order to reduce the amount of power that the integrated circuit requires to operate.

Since the dimensions of the integrated circuit are constrained, for example, at 0.25 microns for the current device technology generation and decreasing to as little as 0.07 microns in 10 years, the only way to reduce the capacitance between the conducting elements is to use an insulative material with a low dielectric constant. Conventional semiconductor fabrication commonly uses silicon dioxide as a dielectric, which has a dielectric constant of about 3.9. The lowest possible or ideal dielectric constant is 1.0, which is the dielectric constant of a vacuum, whereas air has a dielectric constant of less than 1.001.

While air and vacuum have acceptably low dielectric constants, there is another important factor known as dielectric strength which must be taken into consideration. Dielectric strength is typically referred to in one of two ways. One way is breakdown voltage or breakdown field strength. Breakdown field strength is a property with units of volts per unit length at which an insulative material does not insulate, breaks down and results in a short circuit. To calculate the required minimum breakdown field strength for a modern integrated circuit, one takes the operating voltage of the circuit and divides it by the separation distance between adjacent conducting elements. For example, in a 0.25 micron technology integrated circuit that operates at a voltage of 3.3 volts, the minimum breakdown field strength required is 3.3 divided by 0.25 microns, which equals 13.2 volts per micron, or 0.132 MV/cm. Typical safety margins are several times this or a minimum of about 0.5 MV/cm$^2$. The breakdown field strength of air is less than 1 volt per micron.

The second component of dielectric strength is leakage current. Leakage current is low level current flux through an insulator of field strength less than the breakdown field strength. A typical requirement for an integrated circuit is a leakage current density less than $2 \times 10^{-8}$ amps per square centimeter and an applied electric field strength of 0.05 MV/CM.

It is therefore advantageous to provide a material with both a low dielectric constant and a high dielectric strength. Polytetrafluoroethylene (PTFE) is such a material. It has a dielectric constant of 2.0, which is the lowest dielectric constant known for any non-porous material that has a thermal stability high enough to withstand the rigors of integrated circuit manufacturing processes. Bulk PTFE is also known to have very high breakdown field strength and very low leakage current density. However, previous attempts to deposit thin sub-micron films of PTFE onto a silicon wafer have resulted in materials that lack desired dielectric strength. In forming these films, the film is usually sintered to fuse the PTFE particles together to form a coherent film, which is then cooled. Applicants have determined that slowly cooling a sintered thin PTFE film results in a porous material having less than acceptable dielectric strength. It would be advantageous to provide an improved process for depositing and processing the PTFE film which results in high dielectric breakdown field strength and low leakage current density.

SUMMARY OF THE INVENTION

In the present invention, the rate of cooling a sintered coherent film of PTFE is increased, by quenching or employing other suitable cooling techniques, which all result in a PTFE film that has improved dielectric strength properties. When using PTFE as the insulative material in integrated circuits, a high dielectric strength is required for the PTFE to be effective. To form the PTFE thin film of the present invention, the coated PTFE film is sintered to fuse the PTFE particles together to form a coherent film, which is rapidly cooled. It has unexpectedly been found that the rapid cooling procedure of the present invention improves the dielectric properties, i.e., increases breakdown voltage field strength and lowers leakage current density of the PTFE film.

One purpose of the present invention is to provide a method for improving the dielectric strength of an insulative material.

Another purpose of the present invention is to provide an insulative material that has lower leakage current density and higher breakdown voltage.

A further purpose of the present invention is to provide an electronic component with at least one fluoropolymer layer having a weight loss of less than 0.15%/minute at 420° C., a thickness of less than 5 μm, a leakage current density as low as 456 pA/cm$^2$ and a breakdown voltage greater than about 1.6 MV/cm.

DETAILED DESCRIPTION OF THE INVENTION

The present invention comprises a low dielectric constant, high dielectric strength material for use as an insulation element in an electronic device, such as an integrated circuit structure. The integrated circuit structure, which may be an active or passive device, may contain one or more elements of a low dielectric constant, high dielectric strength material of the present invention. These elements are formed from a fluoropolymer dispersion, typically by spin coating. The dielectric properties are determined by the subsequent thermal processing, or sintering. In the present invention, it is shown that submicron PTFE films deposited and sintered on rigid substrates can achieve breakdown voltages as high as those obtained with thick PTFE films. Such thick PTFE films, having a thickness exceeding 25 microns, may have dielectric strength breakdown voltages exceeding 160 volts per micron, 1.6 MV/cm.

As used herein, a fluoropolymer dispersion means a stable isotropic mixture of fluoropolymer particles, water and surfactant. Other components such as a salt or co-surfactant (such as an alcohol, amine, or other amphiphilic molecule) may also be part of the dispersion formulation. The fluoropolymer particles in water reside in distinct domain separated by an interfacial layer rich in surfactant. Fluoropolymers include polytetrafluoroethylene (PTFE) dispersions such as Resin T-30 manufactured by DuPont and Resin D-2 manufactured by Daiken. Other PTFE and fluoropolymer dispersions may also be used. The dispersions may be coated onto the substrates by a number of methods, most preferably by spin coating. Other methods include spraying, dipping, flowing, and meniscus coating.

As the term is used herein "fluoropolymer" means a polymer with a fully fluorinated structure. In a fully fluorinated polymer, essentially all of the hydrogen atoms are replaced by fluorine atoms.

As the term is used herein "fluorinated polymer" means a polymer with a partially fluorinated structure. In a partially fluorinated structure not all of the hydrogen atoms are replaced by fluorine atoms.

As the term is used herein, low dielectric constant means a dielectric constant of between 1 and 2.5, whereas a conventional silicon dioxide dielectric material for use in integrated circuits has a dielectric constant of 3.9 to 4.2. In the present invention, the dielectric constant is preferably in a range from about 1.5 to about 2.2, and most preferably in a range from about 1.3 to about 1.9.

As the term is used herein, high dielectric strength refers to both the properties of breakdown voltage defined in units of applied electronic field strength of volts per micron and leakage current, which is the current density typically in amps per square centimeter or pico amps per square centimeter at a specified electric field strength.

If the dielectric strength is sufficiently high, say a voltage breakdown strength of >0.5 MV/cm and a leakage current of <2×10$^{-8}$ amps per square centimeter at an applied voltage of 0.05 MV/cm, the dielectric layer may be used by itself without the use of other dielectric barriers. If the dielectric strength is low, for example, the breakdown voltage is <100 volts per micron or the leakage current is >100 pico amps per square centimeter at an applied electric field of 10 volts per micron, additional dielectric barriers such as a conformal vapor deposited coating of $SiO_2$ or $Si_3N_4$ may be required. The combined use of a thin, high dielectric strength liner such as mentioned previously and a low dielectric constant material such as PTFE improves device performance. In a preferred embodiment, a dielectric material which has both low dielectric constant and high dielectric strength is used. This combination maximizes the device performance by eliminating the dielectric barrier, which has an undesirably high dielectric constant.

The low dielectric constant material of the present invention is a fluoropolymer, preferably polytetrafluoroethylene (PTFE), that may be spin coat deposited from an aqueous dispersion. A fluoropolymer dispersion means a stable isotropic mixture of fluoropolymer particles, water, and surfactant. Other components such as a salt or cosurfactant (such as an alcohol, amine, or other amphiphilic molecule) may also be part of the dispersion formulation. The fluoropolymer particles in water reside in distinct domain separated by an interfacial layer rich in surfactant. Polytetrafluoroethylene (PTFE) dispersions include Resin T-30 manufactured by DuPont and Resin D-2 manufactured by Daiken. Other PTFE and fluoropolymer dispersions may be used. The terms microemulsion, microdispersion, nanoemulsion or nanodispersion are interchangeably used herein when the particles are 80 nanometers or smaller in dimension.

Microemulsions can have several microstructures, depending upon composition, and sometimes upon temperature and pressure. There are three most common structures. One is an oil-in-water microemulsion where oil is contained inside distinct domains (droplets) in a continuous water-rich domain. The second is water-in-oil microemulsion, so-called inverse microemulsions, where water is contained inside distinct domains (droplets) in a continuous oil-rich domain. The third is a bicontinuous microemulsion where there are sample-spanning intertwined paths of both oil and water, separated from each other by a surfactant-rich sponge-like structure.

ADHESION PROMOTER

Prior to coating the PTFE dispersions to a substrate, an adhesion promoter may be applied. Commercially-available adhesion promoters for other thin films, i.e., non-fluoropolymers, have been used in the semiconductor industry. For example, hexamethyldisilzane (HMDS) is commonly used as an adhesion promoter for photoresist and aminopropyltriethoxysilane (APTS) or similar compounds for polyimide polymers. However, according to the teachings of U.S. Pat. No. 4,849,284 the silane coatings do not bond to the PTFE. The adhesion promoter is usually applied either by vacuum coating or by spin coating with a dilute solution (0.05 to 10 wt. % silane or silazane), typically having a thickness of sub-monolayers up to 10 monolayers. In the present invention, these adhesion promoters typically contain a silane or silizane compound which can bond to the $SiO_2$ surface and a functional group such as a methyl group or an amine group which can bond to the polymer.

Silane compounds, e.g., mono and di-functional silanes, aminoalkylalkoxy silanes, where the alkyl moiety is at least one $C_1$ to $C_4$ alkyl group and said alkoxy is a mono, di or tri $C_1$ to $C_4$ alkoxy group and silazanes improve the bond of PTFE to $SiO_2$ substrates. Suitable silanes and silizanes include:

aminopropyltriethoxysilane,
aminopropyltrimethoxysilane,
aminoethyltrimethoxy silane,
methylaminopropyltrimethoxysilane,
aminopropyltripropoxysilane,
aminopropylmethyidiethoxysilane,
aminopropylethyidiethoxysilane,
aminomethyltriethoxysilane,
aminoisobutyltrimethoxysilane,
aminobutyltethoxysilane.
beta-aminoethyltriethoxysilane,
aminobutylmethyidiethoxysilane,
hexamethyldisilizane,
(aminoethylaminomethyl)-phenethyltrimethoxysilane,
(aminoethylaminomethyl)-phenethyltriethoxysilane,
n-(aminoethyl)-aminopropyl-methyidimethoxysilane,
n-(aminoethyl)-aminopropyl-methyldiethoxysilane,
n-(aminoethyl)-aminopropyl-trimethoxysilane,
n-(aminoethyl)-am inopropyl-triethoxysilane,
p-aminophenyltrimethoxysilane,
p-aminophenyltriethoxysilane,
n-phenylaminopropyltrimethoxysilane,
n-phenylaminopropyltriethoxysilane,
(trimethoxysiliylpropyl)diethylenetriamine,
(triethoxysilypropyl)diethylenetriamine,
aminopropyldimethylmethoxysilane, or
aminopropyidimethylethoxysilane,
alone or incombination with one another.

PTFE NANOEMULSION/DISPERSION

Polymerization of emulsified and microemulsified unsaturated hydrocarbon monomers is known, where high reaction rates, high conversions and high molecular weights can be achieved. A microemulsion can be distinguished from a conventional emulsion by its optical clarity, low viscosity, small domain size, thermodynamic stability and spontaneous formation. Polymerization of microemulsified monomers has many advantages over traditional polymerization of emulsified monomers. Microemulsions are normally transparent to translucent so that they are particularly suitable for photochemical reactions, while emulsions are turbid and opaque. Also, the structural diversity of microemulsions (droplets and bicontinuous) is set by thermodynamics, and rapid polymerization may be able to capture some of the original structure. In addition, microemulsion polymerization enables the production of stable, monodisperse microlatexes containing colloidal particles smaller than those produced from classical emulsion polymerization processes. Smaller particle size improves the ability to form coatings without microcracking. The increased surface area improves particle fusion during molding operations.

Emulsion polymerization, as opposed to microemulsion polymerization, of dissolved gaseous tetrafluoroethylene or its copolymers is a known process. Aqueous colloidal dispersions of tetrafluoroethylene or its copolymers can be prepared in a pressure reactor by placing the gaseous monomer, or a mixture of monomers, in contact with an aqueous solution containing at least one emulsifier, which generally is a fluorinated surfactant, possibly a buffer for keeping the medium at a given pH, and at least an initiator which is capable of forming free radicals at the polymerization temperature. The free radical initiators can be water soluble peroxides, or alkaline or ammonium persulfates. Persulfate can be used alone if the polymerization temperature is above approximately 50° C., or in association with a reducing agent such as ferrous salt, silver nitrate, or sodium bisulfite if the polymerization temperature is approximately between 5 to 55° C., as described in the U.S. Pat. No. 4,384,092, which is incorporated herein by reference.

The gaseous monomer molecules in the foregoing process enter the aqueous liquid and react to form polymer without first forming a distinct liquid phase. Thus, the polymer particles are large particles suspended in the aqueous mixture; and the process is not a true liquid-in-liquid emulsion polymerization. The process is sometimes referred to as dispersion polymerization.

Microemulsion polymerization operates by a different mechanism than emulsion polymerization. It involves polymerization of liquid monomer rather than gaseous monomers. Because the polymerization involves polymerization of unusually small cells of liquid monomer, the resulting polymer particles are unusually small. However, polymerization of liquid TFE is not usually practiced because of the well known potential handling hazards.

The thickness of an ILD formed in accordance with the teachings herein is in a range of from about 0.1 to about 5.0 $\mu$m. More typically, the thickness is in a range of from about 0.5 to about 1.5 $\mu$m. Such a range of thicknesses may be particularly desired for producing present and future generation integrated circuit structures.

The low dielectric material of the present invention is a fluoropolymer which may be deposited from a microemulsion or microdispersion comprising particles of approximately an average size of from about 1 to about 80 nanometers (0.001 to 0.080 micrometers), preferably from about 1 to about 60 nanometers, and most preferably from about 1 to about 30 nanometers; surfactant; and water. The fluoropolymer may include, but is not limited to, polytetrafluoroethylene (PTFE), fluorinated ethylenepropylene (FEP), fluoromethacrylate (Fac), or perfluoroalkoxy polymer (PFA).

The low dielectric constant material of the present invention may be deposited to form an ILD by a spin coating process using a microemulsion liquid. The spin coating process is comprised of several steps which are outlined hereinafter:

1) A substrate, such as a silicone wafer for example, is spun at about 500 RPM. While the substrate is spinning at such a speed, a wetting agent, such as isopropanol, is dispensed onto the surface of the spinning substrate to wet out the surface of the substrate.

2) A fluoropolymer microemulsion is dispensed onto the surface of the spinning substrate, while it is spinning at 500 rpm.

Figure 1:
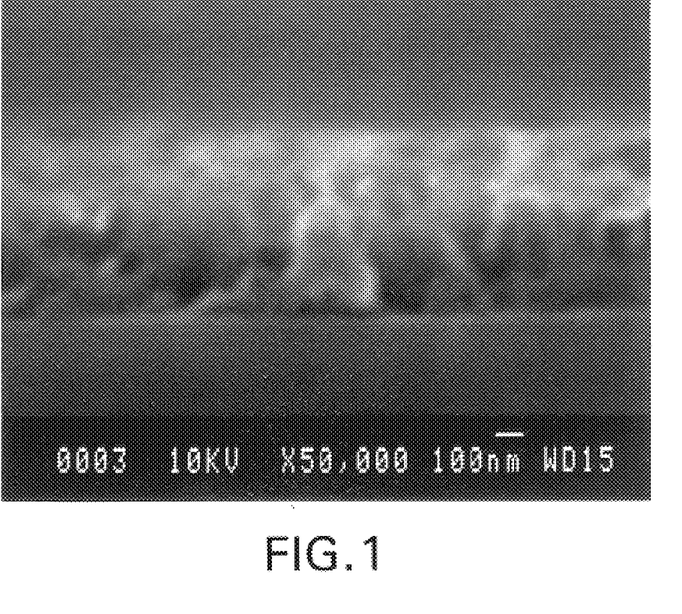
FIG. 1 is an scanning electron micrograph (SEM) cross-section of a 0.75 micron PTFE film.
Figure 2:
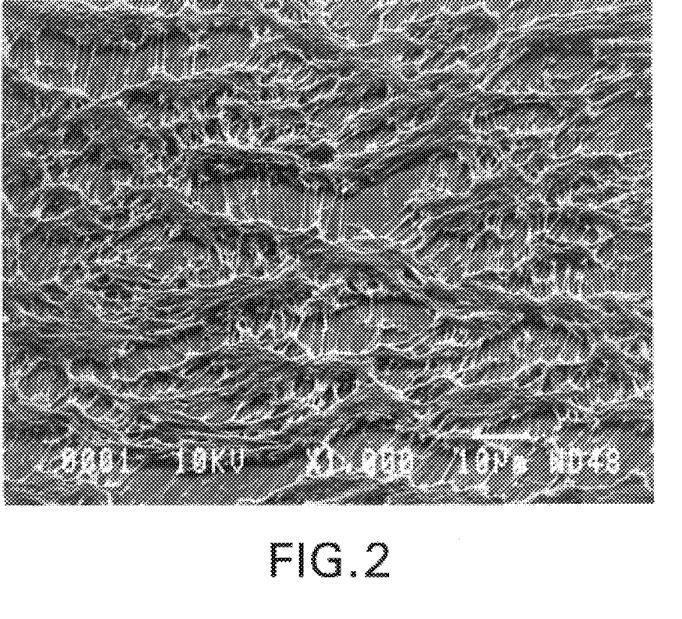
FIG. 2 is an SEM surface view of a single crystal silicon wafer which has been coated with a bicontinuous PTFE microemulsion.
Figure 3:
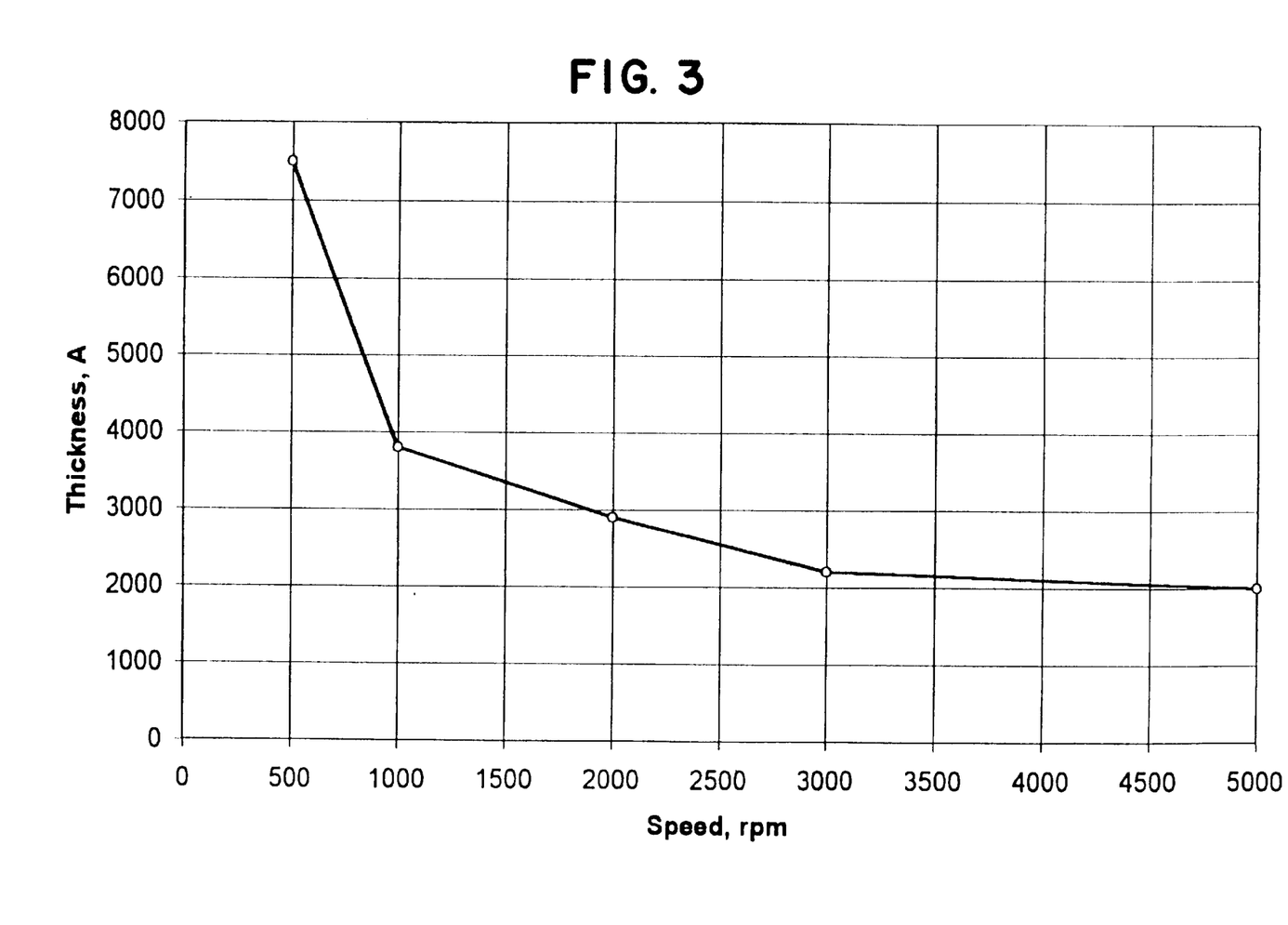
FIG. 3 is a graph of Deposited Film Thickness (Angstroms) v. Spin Speed (RPM).

3) The rotational speed of the substrate is next increased to a range of from about 1000 to about 5000 RPM. The rotational speed employed determines the thickness of the dielectric layer achieved, as best seen by reference to FIG. 3.

4) The increased rotational speed is maintained, until the coating thickness of the microemulsion stabilizes. Typically, stabilization occurs in a range from about 10 to about 50 seconds, depending on the rotational speed. In this regard, a faster speed requires less time to stabilize.

5) The coated substrate is initially baked at a temperature of about 200° C. to drive off the water and surfactant of the microemulsion.

6) Thereafter, the substrate is baked at near the melting point of the fluoropolymer in order to improve its adhesion to the substrate.

7) The substrate is slowly cooled to about 200° C. by raising it above the surface of a heating device, such as a hot plate for example. 8) Finally, the substrate is cooled to an ambient temperature condition by using a chill plate.

If desired, the substrate may be planarized, imaged, and/or etched by employing conventional integrated circuit processing techniques which are known to those skilled in the art.

The low dielectric material may have porosity induced in order to reduce its dielectric constant. The porosity may be created by employing a bicontinuous microemulsion. Such a bicontinuous fluoropolymer microemulsion system contains both oil (monomer) phase and aqueous phase intertwined into each other, separated by surfactant layers. A rapid polymerization of the monomers (oil phase) can capture the unpolymerized microstructure. When the water is removed during the drying step, a porous structure is left behind.

The formed PTFE film should be sintered at a temperature typically in a range from about 350° C. to about 390° C. in order to fuse the particles together and to form a coherent film. PTFE has a coefficient of thermal expansion (CTE) of approximately 50–150 ppm per degree Centigrade. The substrate upon which the PTFE is coated is typically pure, single crystal silicon with a CTE of approximately 5 ppm per degree Centigrade. The silicon substrate is very thick compared to the PTFE film, typically a 600 micron thickness of silicon compared to 0.1 to 5.0 micron thickness of PTFE, and the silicon substrate has a very high elastic modulus of approximately 16 million psi, whereas the PTFE film has a relatively low elastic modulus of approximately 58,000 psi at room temperature.

Upon conventional cooling from sintering, the PTFE is subjected to high tensile forces because the relatively high CTE of the PTFE causes it to shrink while the low CTE and high modulus and high thickness of the silicon substrate restrain this shrinkage. The tensile stress in the PTFE may exceed its yield stress, and the PTFE can separate into a porous structure which lowers both the effective dielectric constant and effective dielectric strength of the film.

In the present invention, the sintering parameters of time, temperature, and cooling rate are modified in order to produce a dielectric film which has the desired properties of low dielectric constant and high dielectric strength. In particular, the low dielectric constant is insured through the use of PTFE, which has a dielectric constant of 2.0. The high dielectric strength is maintained by adjusting the sintering parameters, most specifically the cooling rate. In particular, it was discovered that a sufficiently high cooling rate, hereinafter referred to as a quench, prevents porosity from forming in the PTFE film and thus preserves the inherent high dielectric strength of PTFE.

The rapid cooling may be accomplished by a number of methods. The method used in this invention is the rapid transfer of a silicon coated with PTFE from the hot plate used for sintering to another hot plate which is maintained at a lower temperature or a chilled plate which is cooled with the use of circulating chilled water in a range from about 13° C. to about 280° C. The hot plates and chill plates used are equipped with a vacuum apparatus that holds the substrate in intimate contact with a relatively thin (600 micron) substrate and the silicon substrate has a relatively high thermal conductivity. Accordingly, the PTFE film on the top of the substrate very rapidly achieves temperature equilibrium with the hot plate or chill plate.

Other methods of sintering and cooling the PTFE film on the substrate may be used, such as rapid thermal annealing (RTA). The particular method of achieving the sintering temperatures and appropriate cooling rates is not deemed important, rather it is the cooling rate itself which determines the dielectric properties of the PTFE film.

It is important to achieve accurate measurement of both temperatures and cooling rates in order to insure appropriate film properties. Temperatures are measured with the use of a Supermole Gold temperature data acquisition device manufactured by ECD Corporation. The thermocouples must be very thin, high response thermocouples, such as an Omega CHAL-001 or an Omega Z02-K thermocouple from Omega Engineering. In addition, the adhesive used to bond the thermocouple to the silicon wafer must have good temperature stability and good thermal conductivity. In the present invention, Omega type CC high temperature cement is used for this purpose. The thermocouples are very precise and have a fast response time. The data collection unit samples at approximately 10 samples per second. The dielectric properties are measured with the use of a Mercury Contact Probe from MSI Industries, a Hewlett-Packard pico amp meter, and a Hewlett-Packard LCR meter.

For the purpose of performing the electrical tests, the PTFE films are deposited onto a silicon substrate which has been previously coated with a thin layer of metal such as aluminum or copper. This metal layer forms the bottom electrode, and the mercury probe forms the top electrode. A PTFE dispersion is applied to the $SiO_2$ coated substrate by the method of spin coating, although other methods may be used such as spraying or dipping. The PTFE dispersions which may be used are T-30 from DuPont and D-2 from Daiken and are applied to the optional adhesion promoter coated substrate, described above.

A quantity of 5–10 milliliters of PTFE dispersion is dispersed onto the substrate while it spins at a slow speed of approximately 50 RPM. The entire surface of the substrate is wetted with the PTFE dispersion. The speed of the spin coater is then increased to between 500 and 5000 RPM to achieve the desired thickness of the dispersed film. The film may then be dried at a temperature of about 250° C. to remove the residual water and surfactants, and finally the dried film is sintered at a temperature between 350° C. and 390° C. This sintering step fuses together the PTFE particles. Most preferably, the sintering step is maintained for a period of 1 hour, although shorter treatments of as short as a few seconds may be used. The longer sintering treatments improve the adhesive bond; however, this improvement in bond strength may not be necessary, depending on the application requirements. The shorter sintering times may provide adhesive bond strength which is sufficient for the remainder of the device manufacturing and use conditions. The thin layer of metal serves as one reference electrode while the mercury contact probe serves as the other reference of electrode on the top side of the film. A voltage is applied by the pico amp meter, and the resulting leakage current is collected. It is essential to provide appropriate shielding and grounding for the current measurement apparatus since the measured currents are very low, often on the order of pico amps.

MICROEMULSION POLYMERIZATION PROCEDURE FOR PRODUCING SMALL PARTICLES OF POLYTETRAFLUOROETHYLENE

An aqueous microemulsion polymerization procedure produces unusually small particles of polytetrafluoroethylene (PTFE) which is particularly useful to form a low dielectric constant ILD in accordance with the teachings herein.

The ingredients, ratios and conditions of the microemulsion are selected to result in polymerization of liquid tetrafluoroethylene (TFE). In one aspect, the resulting polymers have a three-dimensional continuous micro-network of fibrils and bundles of fibrils and randomly dispersed platelets of TFE polymers. In another aspect, the resulting polymer produced is a gel characterized as a spongy mass comprised visually of layers of sheet-like configurations, and which has a microstructure of a three-dimensional continuous network of convoluted randomly disposed fibrils and bundles of fibrils of TFE polymers.

In another aspect, the polymer produced is characterized as a spongy mass having a microstructure of predominantly randomly disposed platelets interconnecting or interpenetrating one another and also being randomly connected by randomly disposed fibrils, to form a three-dimensional continuous network of TFE polymer. In still another aspect, very small particles of TFE polymer are produced. Which form of polymer is produced depends on the ratio of surfactant to liquid TFE, as described above. By microstructure, and the like, it is meant that the structure is not visible to the naked eye.

To form the polymers, a mixture of liquid tetrafluoroethylene (TFE) and at least one fluorinated surfactant in water is employed. The TFE may be introduced to the reaction vessel in liquid form, or in gaseous form and subsequently liquefied, in the presence of microemulsified seed particles, or micelles, of a liquid perfluorinated hydrocarbon that is a saturated aliphatic or aromatic organic compound having up to 2 oxygen, nitrogen, or sulfur atoms and a molecular weight preferably below 500.

PTFE produced from microemulsion polymerization when the surfactant/monomer ratio is at least 1.17 are usually small, being on the order of an average size of from 1 to 80 nanometers (0.001 to 0.080 micrometers), preferably 1 to 60 nanometers and most preferably 1 to 30 nanometers, and a polymer average molecular weight of over 100,000, preferably over 500,000 and most preferably over 1,000,000. It is believed that such unusually small polymer particles are obtained because polymerization of the gaseous TFE takes place inside the very small micelles of the hydrocarbon organic compound in the microemulsion.

The amount of surfactant used in the reaction is adjusted to maximize the formation of the type of particle desired, as described above. A suitable fluorinated surfactant or a mixture of fluorinated surfactants are needed with the weight ratio of the surfactants to monomers in the liquid phase of being adjusted according to the product desired. There is no criticality in an upper limit, but generally one usually does not go higher than 5:1. Suitable fluorinated surfactants include a fluorinated anionic surfactant, for example a salt of a fluorinated carboxylic acid or a sulfonic acid, a sulfate, a cationic surfactant for example a fluorinated quartenary ammonium salt; or a fluorinated nonionic surfactant. The mixture can be formed preferably at a temperature below the critical temperature (Tc) of TFE, approximately 33.3° C. for TFE, and above the freezing temperature of the surfactant containing aqueous solution. Mechanical stirring can be provided. Free radical polymerization can be initiated by adding water-soluble free radical initiators, for example, a peroxide, an alkaline or ammonium persulfate, or some water soluble azo cmpounds or a salt of permanaganate. The free radical initiators can also be used in ssociation with a reducing agent such as ferrous salt, silver nitrate, sodium bisulfite, and the like. It is also possible to initiate the polymerization by photochemical reactions. The possible photoradiation source include ultraviolet (UV) light, electron beam, or gamma radiation. The polymerization temperature can be between 5 to 100° C., and preferably between 5 to 33.3° C. for polytetrafluoroethylene.

Comonomers that may be present in the mixture include halogenated (chlorine or fluorine) olefins of 2–18 carbon atoms, for example vinyl chloride, vinylidene chloride, chlorotrifluoroethylene, hexafluoropropylene, perfluoroalkyl vinyl ether, or the like; hydrogenated unsaturated monomers, such as ethylene, propylene, isobutylene, vinyl acetate, acrylates, or the like; crosslinking agents, such as glycidylvinylether, chloroalkyl vinyl ether, allylglycidylether, acrylates, methacrylates, or the like. The amount of comonomer that can be present should not be so great as to change the nature of the product that would be obtained if PTFE had been the product.

The perfluorinated hydrocarbon is a low molecular weight compound that is liquid at the temperature at which polymerization is carried out. The molecular weight is preferably less than 500. The perfluorinated hydrocarbon preferably has a boiling point less than 230° C. The perfluorinated hydrocarbon can be a perfluorinated saturated aliphatic compound such as a perfluorinated alkane; a perfluorinated aromatic compound such as perfluorinated benzene, or perfluorinated tetradecahydro phenanthene. It can also be a perfluorinated alkyl amine such as a perfluorinated trialkyl amine. It can also be a perfluorinated cyclic aliphatic, such as decalin; and preferably a heterocyclic aliphatic compound containing oxygen or sulfur in the ring, such as perfluoro-2-butyl tetrahydrofuran.

Examples of perfluorinated hydrocarbons include perfluoro-2-butyltetrahydrofuran, perfluorodecalin, perfluoromethyidecalin, perfluorodimethyldecalin, perfluoromethylcyclohexane, perfluoro(1,3-dimethylcyclohexane), perfluorodimethyldecahydronaphthalene, perfluorofluoorene, perfluoro(tetradecahydrophenanthrene), perfluorotetracosane, perfluorokerosenes, octafluoronaphthalene, oligomers of poly (chlorotrifluoroethylene), perfluoro(trialkylamine) such as perfluoro(tripropylamine), perfluoro(tributylamine), or perfluoro(tripentylamine), and octafluorotoluene, hexafluorobenzene, and commercial fluorinated solvents, such as Fluorinert FC-75 which is produced by the 3M Company. The fluorinated alkanes can be linear or branched, with a carbon atom number between 3 and 20. Oxygen, nitrogen or sulfur atoms can be present in the molecules, but the number of such atoms per molecule should be 2 or less.

The preparation of the microemulsion depends on careful selection of the ingredients. The microemulsion is prepared by mixing water, perfluorinated hydrocarbon, fluorinated surfactant(s), and optionally cosolvents or inorganic salts. The amounts employed are 0.1–40 weight percent, preferably 0.1–20, of the perfluorinated hydrocarbon; 0.1–40 weight percent, preferably 0.1–25, of the surfactant; and optionally cosurfactants; with the remainder water. The microemulsified perfluorinated hydrocarbons are believed to serve as microreactors for fluorinated monomers to enter and to be polymerized. The temperature of the microemulsion formation can be between 0 to 150° C., preferably 40 to 100° C.

The fluorinated surfactant has the structure $R_f E X$, where $R_f$ is a fluorinated alkyl group with a carbon number between 4 and 16, E is an alkylene group with a carbon number between 0 and 4, and X is an anionic salt such as COOM, $SO_3M$, $SO_3NR_2$, $SO_4M$, a cationic moiety such as quarternary ammonium salt, or an amphoteric moiety such as aminoxide, or a non-ionic moiety such as $(CH_2CH_2O)_nH$; and M is H, Li, Na, K, or $NH_4$; R is a 1 to 5C alkyl group and n is a cardinal number of 2 to 40.

When tetrafluoroethylene is referred to herein, it is understood the term includes the so-called modified "homopolymer", in which the polymer chain includes very small amounts of units derived from perfluorol(propyl vinyl ether) or hexafluoropropylene.

To initiate polymerization, the temperature of the microemulsion is adjusted to between 0 and 150° C., preferably 40 to 100° C. Initiators for polymerization include free-radical initiators, such as persulfates, azo initiators, peroxides, or photo initiators which can generate free radicals by ultraviolet or gamma rays. Amount of initiators present can range between 0.001 to 5 percent by weight based on the final polymer content. Cosolvents such as an alcohol, amines or other amphiphilic molecules, or salt can be employed if desired to facilitate formation of the microemulsion.

Tetrafluoroethylene is introduced to the reactor from the vapor phase into the aqueous microemulsion phase. Sufficient mixing between liquid and vapor phase is important to encourage mass transfer. The mechanism of forming the ultra small polymer particles is not fully understood. It is believed that the higher the solubility of the tetrafluoroethylene monomer in the perfluorinated hydrocarbon, the better to achieve the original microemulsion particle size and shape. The time of reaction may be between 1 and 500 minutes.

The resulting polymer particles in the resulting dispersion have an average particle size of between 1 and 80 nanometers, preferably 1 to 60, most preferably 1 to 30, and a polymer average molecular weight of over 100,000, preferably over 1,000,000. The unusually small particle size provides a polymer system with a number of advantages over systems containing larger particles. The system is an aqueous colloidal dispersion, and is clear rather than turbid.

A small amount of units from comonomers may be present in the polymer, provided the amount of comonomer that can be present is not so great as to change the nature of the product that would be obtained if PTFE had been the product. In other words, the copolymer is still not melt processible. The comonomer can be the halogenated (chlorine or fluorine) olefin of 2–18 carbon atoms described above.

One suitable microemulsion for use as an ILD in accordance with the teachings here had a weight ratio of surfactant to TFE liquid monomer of 330/230, i.e., well over 1.17. The resulting polymer was comprised of very small particles of PTFE, on the order of from about 0.001 to 0.06 micrometer. Such a material may be made by initially charging into a 10 liter pressure vessel, 5 Kg of deionized $H_2O$ and 330 g of ammonium perfluoroctanoate (Fluorad FC143, 3M). The pressure vessel was under vacuum and had been purged with tetrafluoroethylene gas by a vacuum repressive sequence three times. The oxygen content of the aqueous mixture was less than 20 ppm. The pressure vessel was cooled to be about 10° C. and tetrafluoroethylene gas was fed into the reactor and some tetrafluoroethylene was allowed to condense into a liquid form in aqueous phase. Total amount of liquid tetrafluoroethylene charged to the pressure vessel was about 230 g. The APFO/TFE ratio was over 1.17. The pressure vessel was equipped with a mixer and was used to stir the aqueous mixture at a speed of about 400 rpm. 2 grams of ammonium persulfate in 100 g $H_2O$ were charged to the vessel, followed by 1 gram of ferrous sulfate ($FeSO_4$) and 2 grams of sodium sulfite ($Na_2SO_3$) in 100 g $H_2O$ to initiate polymerization. The pressure inside the vessel was about 30 $Kg/cm^2$ starting from initiation to the end of about 2 hours reaction time. There was no significant pressure change throughout the reaction, which indicated that very little tetrafluoroethylene in the vapor phase participated the reaction. The temperature of the aqueous mixture inside the vessel was maintained between 10–12° C., employing brine water. After about 2 hours of reaction, tetrafluoroethylene gas was released from the vessel and the aqueous dispersion was discharged.

The aqueous dispersion looked clear, and contained about 4% polymer content. The melting temperature of the polymer was determined by Differential scan Calorimetry (DSC) to be about 331° C., which is in the melting range of polytetrafluoroethylene. The clarity of the dispersion is indicative of the presence of small particles on the order of 0.06 micrometer or less in size.

An ILD formed by a microemulsion of PTFE will have a dielectric constant of between 1.0 and 2.5.

MICROEMULSION POLYMERIZATION PROCEDURE FOR PRODUCING SMALL PARTICLES OF MELT PROCESSIBLE FLUOROPOLYMER PARTICLES

An aqueous microemulsion polymerization procedure produces unusually small particles of melt-processible fluoropolymers. During this procedure, the polymerization is carried out in the presence of microemulsified seed particles, or micelles, of a liquid perfluorinated hydrocarbon that is a saturated aliphatic or aromatic organic compound having up to two oxygen, nitrogens, or sulfur atoms and a molecular weight preferably below 500.

The polymer particles so produced are usually small, being on the order of about 1 to 80 nanometers (0.001 to 0.080 micrometers), preferably 1 to 60 nanometers, and most preferably 1 to 30 nanometers. It is believed that such unusually small polymer particles are obtained because polymerization takes place inside the very small micelles of the hydrocarbon organic compound in the microemulsion.

The perfluorinated hydrocarbon is a low molecular weight compound that is liquid at the temperature at which polymerization is carried out. The molecular weight is preferably less than 500. The perfluorinated hydrocarbon preferably has a boiling point less than 230° C. The perfluorinated hydrocarbon can be a perfluorinated saturated aliphatic compound such as a perfluorinated alkane; a perfluorinated aromatic compound such as perfluorinated benzene, or perfluorinated tetradecahydro phenanthene. It can also be a perfluorinated alkyl amine such as a perfluorinated trialkyl amine. It can also be a perfluorinated cyclic aliphatic, such as decalin; and preferably a heterocyclic aliphatic compound containing oxygen or sulfur in the ring, such as perfluoro-2-butyl tetrahydrofuran. Examples of perfluorinated hydrocarbons are descibed above.

The preparation of the microemulsion depends on careful selection of the ingredients. The microemulsion is prepared by mixing water, perfluorinated hydrocarbon, fluorinated surfactant(s), and optionally cosolvents or inorganic salts. The amounts employed are 0.1–40 weight percent, preferably 0.1–20, of the perfluorinated hydrocarbon; 1–40 weight percent, preferably 0.1–25, of the surfactant; and optionally cosurfactants; with the remainder water. The microemulsified perfluorinated hydrocarbons are believed to serve as microreactors for fluorinated monomers to enter and to be polymerized. The temperature of the microemulsion formation can be between 0 to 150° C., preferably 40 to 100° C.

The fluorinated surfactant has the structure $R_f E X$, where $R_f$ is a fluorinated alkyl group with a carbon number between 4 and 16, E is an alkylene group with a carbon number between 0 and 4, and X is an anionic salt such as COOM, $SO_3M$, $SO_3NR_2$, $SO_4M$, a cationic moiety such as quarternary ammonium salt, or an amphoteric moiety such as aminoxide, or a non-ionic moiety such as $(CH_2CH_2O)_nH$; and M is H, Li, Na, K, or $NH_n$; R is a 1 to 5C alkyl group and n is a cardinal number of 2 to 40.

The polymerizable fluorinated monomers that are other than tetrafluoroethylene, include hexafluoroethylene, perfluoro alkyl vinyl ether, trifluoroethylene, vinylidene fluoride, vinyl fluoride, chlorotrifluoroethylene. Nonfluorinated monomers can be used as comonomers, such as vinylidene chloride, vinyl chloride, ethylene, propylene, butadiene. The monomer is preferably free-radical polymerizable, and preferably is ethylenically unsaturated.

To initiate polymerization, the temperature of the microemulsion is adjusted to between 0 and 150° C., preferably 40 to 100° C. Initiators for polymerization include free-radical initiators, such as persulfates, azo initiators, peroxides, or photo initiators which can generate free radicals by ultraviolet or gamma rays. Amount of initiators present can range between 0.001 to 5 percent by weight based on the final polymer content. Cosolvents such as an alcohol, amines or other amphiphilic molecules, or salt can be employed if desired to facilitate formation of the microemulsion.

The fluorinated gaseous monomers are introduced to the reactor from the vapor phase into the aqueous microemulsion phase. Sufficient mixing between liquid and vapor phase is important to encourage mass transfer. The mechanism of forming the ultra small fluorinated melt- processable polymer particles in this invention is not fully understood. It is believed that the higher the solubility of the monomers in the perfluorinated hydrocarbon, the better to achieve the original microemulsion particle size and shape. The time of reaction may be between 1 and 500 minutes.

The resulting polymer particles in the resulting dispersion have an average particle size of between 1 and 80 nanometers, preferably 1 to 60, most preferably 1 to 30, and a polymer average molecular weight of over 100,000, preferably over 1,000,000. The unusually small particle size provides a polymer system with a number of advantages over systems containing larger particles. The system is an aqueous colloidal dispersion and is clear rather than turbid.

BICONTINUOUS MICROEMULSION POLYMERIZATION PROCEDURE FOR PRODUCING SMALL PARTICLES OF POLYTETRAFLUOROETHYLENE

One method of polymerizing liquid tetrafluoroethylene in an aqueous dispersion is described below and in U.S. Pat. Nos. 5,399,640 and 5,403,900, which are incorporated herein by reference.

The ingredients, ratios and conditions are selected to result in polymerization of liquid tetrafluoroethylene (TFE) and optionally, minor amounts of other fluorinated ethylenically-unsaturated monomers that can be present. Free radical polymerization of the monomers produces polymers of tetrafluoroethylene. The polymers have a three-dimensional continuous micro-network of fibrils and bundles of fibrils and randomly dispersed platelets.

The polymer produced is a gel characterized as a spongy mass comprised visually of layers of sheet-like configurations, and which has a microstructure of a three-dimensional continuous network of convoluted randomly disposed fibrils and bundles of fibrils. The spongy mass may also have a microstructure of predominantly randomly disposed platelets interconnecting or interpenetrating one another and also being randomly connected by randomly disposed fibrils, to form a three-dimensional continuous network.

To form such polymers, a mixture of liquid tetrafluoroethylene (TFE) monomer and at least one fluorinated surfactant in water is employed. The TFE is introduced to the reaction vessel in liquid form and the amount of surfactant used in the reaction is adjusted to maximize the formation of a bicontinuous microemulsion system. It is believed that a bicontinuous microemulsion is formed spontaneously. A suitable fluorinated surfactant or a mixture of fluorinated surfactants is needed with the weight ratio of the surfactants to all monomers of from (in the liquid phase) at least 1:10, and preferably from 1:4 or 1:2 or higher in surfactant concentration. There is no criticality in an upper limit, but generally one usually does not go higher than 5:1. The amounts of the surfactants employed are from about 0.5 to about 50 weight percent, preferably from about 1 to about 20 percent; the amounts of total monomers (in the liquid phase) are from about 0.5 to about 50 weight percent; preferably from about 1 to about 30 percent; with the remainder water and optionally some salts. Suitable fluorinated surfactants include a fluorinated anionic surfactant, for example a salt of a fluorinated carboxylic acid or a sulfonic acid, a sulfate, a cationic surfactant for example a fluorinated quartenary ammonium salt; or a fluorinated nonionic surfactant. The mixture is formed at a temperature below the critical temperature (Tc) of TFE for example approximately 33.3° C. for TFE, and above the freezing temperature of the surfactant containing aqueous solution. Pressure should be below the critical pressure of TFE (i.e. below 39 atmospheres). Mechanical stirring can be provided. Free radical polymerization can be initiated by adding water-soluble free radical initiators, for example, a peroxide, an alkaline or ammonium persulfate, or some water soluble azo compounds or a salt of permanaganate. The free radical initiators can also be used in association with a reducing agent such as ferrous salt, silver nitrate, sodium bisulfite, and the like. It is also possible to initiate the polymerization by photochemical reactions. The possible photoradiation sources include ultraviolet (UV) light, electron beam, or gamma radiation. The polymerization temperature is below the critical temperature of polytetrafluoroethylene which is about 33.3° C. A lower temperature can be any temperature above the freezing point of the mixture, but practically about 5° C. is preferred.

Comonomers that may be present in the mixture include the same halogenated (chlorine or fluorine) olefins of 2–18 carbon atoms described above.

Free radical polymerization of the unsaturated monomers in such aqueous system can sometimes yield an aqueous medium containing colloidal fluorinated olefins having three-dimensional continuous network microstructure or can yield a spongy gel material.

Without intending to limit the scope of the present invention, the apparatus and method of production of the present invention may be better understood by referring to the following examples:

APPLICATION OF THE ADHESION PROMOTER

In one embodiment, an adhesion promoter such as aminopropyltriethoxysilane, which is commercially available from DuPont as Paryline VM652 is used. The VM652 is applied to the silicon dioxide coated wafer by means of spin coating, although other methods may be used such as dipcoating, spraying, or evaporation coating.

Approximately 5 milliliters of VM652 is dispensed onto the wafer while the wafer is rotating at a slow speed of approximately 50 RPM. The entire surface of the wafer is wetted with the adhesion promoter solution. The speed of the spin coater is then increased to between 1000 to 3000 RPM, most preferably 1000 RPM, until the adhesion promoter solvent has evaporated. This may be visually observed and typically occurs in about 30 seconds at 1000 RPM or 10 seconds at 3000 RPM. The adhesion promoter may then be dried at 130° C. for 60 seconds. This drying step promotes the cross-linking of the silane molecule of the adhesion promoter to the $SiO_2$ coated substrate. Thereafter the PTFE dispersions may be coated onto the substrates by a number of methods, most preferably spin coating. Other methods include spraying, dipping, flowing, and meniscus coating.

APPLICATION OF THE PTFE NANOEMULSION/DISPERSION

A PTFE dispersion is applied to the $SiO_2$ coated substrate by the method of spin coating, although other methods may be used such as spraying or dipping. PTFE dispersions which may be used are T-30 from DuPont and D-2 from Daiken. The PTFE dispersion is then applied to the adhesion promoter coated substrate in a similar method. A quantity of 5–10 milliliters of PTFE dispersion is dispersed onto the substrate while it spins at a slow speed of approximately 50 RPM. The entire surface of the substrate is wetted with the PTFE dispersion. The speed of the spin coater is then increased to between 500 and 5000 RPM to achieve the desired thickness of the dispersed film. The film may then be dried at a temperature of about 250° C. to remove the residual water and surfactants, and finally the dried film is sintered at a temperature between 350° C. and 390° C. This sintering step fuses together the PTFE particles. Most preferably, the sintering step is maintained for a period of 1 hour, although shorter treatments of as short as a few seconds may be used. The longer sintering treatments improve the adhesive bonds; however, this improvement in bond strength may not be necessary, depending on the application. The shorter sintering times may provide adhesive bond strength which is sufficient for the remainder of the device manufacturing and use conditions.

The adhesion of thin, submicron films on substrates is determined using the stud pull test. This test is recognized by leading semiconductor companies and by SEMATECH as a valid adhesion test method for thin films on substrates. Other techniques for evaluating the strength of adhesion include scratch testing, scotch tape testing per ASTM specification method D3359-93, thermal shock testing, bulge testing, and 4-point bend testing.

In the stud pull test, a small metal nail—or stud—is glued to the film. The stud is then pulled perpendicular to the film until the stud separates from the film or substrate. The load at which this failure occurs is then recorded and converted into a value of stress. The stress is calculated by dividing the force by the cross-sectional area of the adhesive bond of the stud to the substrate or film. The stud used in the test must be machined to very close tolerances. The stud surface that is glued to the substrate must be perpendicular to the shaft of the stud such that a straight pull may be achieved. In addition, the adhesive bond of the stud to the film surface should not be of lower strength than the adhesion of the film to the substrate. In addition, the adhesive must not contain any air bubbles that would reduce the cross-sectional area of the test, and the adhesive must be applied in a manner that insures that the adhesive does not seep out from underneath the stud and increase the cross-sectional area of the test.

For the purposes of evaluating stud pull adhesions of PTFE films, the PTFE film must be treated before the adhesive is applied in order to insure adequate adhesion of the stud adhesive. Most typically, this is done with the use of a brief oxygen plasma treatment followed by the deposition of a thin layer (about 1 micron) of $SiO_2$. The oxygen plasma treatment insures good adhesion of the $SiO_2$ to the PTFE, referred to as a cap layer. For the purpose of making integrated circuits and testing integrated circuit materials for adhesion, the use of the $SiO_2$ cap layer is preferred for adhesion testing because actual devices also will contain such an $SiO_2$ cap layer in many instances. Thus, performing the adhesive test with the $SiO_2$ cap layer is very similar to an actual integrated circuit device.

In order to complete the adhesion testing process of the PTFE coated substrate, the substrate is placed into a vacuum chamber and subjected to a brief oxygen plasma etch. In this invention, the etching was done in a Plasmatherm 7000 series reactive ion etching unit. The etch gas was oxygen at a flow rate of 400 SCCM, a chamber pressure of 150 millitorr, and a power of 500 watts. The etching is typically conducted for a period of 15 seconds. The etched substrate is then coated with $SiO_2$ in a Plasmatherm 7000 series CVD reactor with a flow rate of 400 SCCM silane, 1400 SCCM nitrous oxide, a chamber pressure of 100 millitorr, and a process power of 500 watts. Aluminum studs with a diameter of 4.5 MM were then glued to samples of the substrates using an epoxy adhesive such as Araldite adhesive from Super Glue Corporations. The samples were then left to cure for a period of about 24 hours. Adhesion testing was then performed on a Dage microtester 22. Failure of load values were recorded and then converted into stress values.

A 1 micron thick oxide layer was applied to 6 bare silicon wafers in a Plasmatherm 700 series CVD reactor with a gas flow rate of 400 SCCM silane, 1400 SCCM nitrous oxide, a chamber pressure of 100 millitorr, and a power of 500 watts. APTS was applied to 2 wafers used a spin coater. The wafers were spun for 10 seconds at 50 rpm to allow a manual dispense of APTS. After the wafers were wetted thoroughly with the APTS the wafers were then spun for 30 seconds at 1000 rpm to remove all excess material and allow the promoter solvent to evaporate. The wafers were then passed onto a hot plate set at a temperature of 130° C. with direct contact for 60 seconds to allow curing of the APTS, and then were cooled on a chill plate (~13° C.) for 10 seconds.

HMDS was applied to 2 wafers using a similar procedure. The wafers were spun for 10 seconds at 50 rpm to allow a manual dispense of the HMDS. After the wafers were wetted thoroughly with the HMDS the wafers were then spun for 30 seconds at 1000 rpm to remove all excess material and allow the promoter solvent to evaporate. The wafers were then baked in an oven under N2 purge for 1 hour at 200° C.

The PTFE dispersions T-30 and D-2 were also applied using the spin coater. All 6 wafers were spun for 10 seconds at 50 rpm to allow a manual dispense of the PTFE. After the wafers were wetted thoroughly with the PTFE the wafers were allowed to sit for 10 seconds. The wafers were then spun for 45 seconds at 920 rpm to remove all excess material and allow the water to evaporate. The wafers were then passed to a hot plate operating at a temperature of 250° C. The wafers were allowed to preheat for 30 seconds at a setting of 20 steps above the hot plate and then direct contact for 60 seconds to bake off the surfactant. The baked wafers were then sintered at 390° C. for 5 minutes and immediately cooled on a chill plate (~130° C.) for 15 seconds. A surface treatment was applied to the wafers in a Plasmatherm 7000 series reactive ion etching unit with oxygen as the etch gas at a flow rate of 150 SCCM, a chamber pressure of 100 millitorr, and a power of 125 watts with an exposure time of 50 seconds. A final $SiO_2$ cap (1 micron thick) was then applied to the wafers in a Plasmatherm 7000 series CVD reactor with a flow rate of 400 SCCM silane, 1400 SCCM nitrous oxide, a chamber pressure of 100 millitorr, and a power of 500 watts.

The wafers were cleaved into squares of a surface area of 1 $cm^2$ to 1 $in^2$. Metal studs of surface areas 0.025 $in^2$ were glued perpendicular to the stud shaft onto these squares using Quick Setting Epoxy by Super Glue Corporation. It was essential that only the amount of glue needed to completely cover the end of the stud was applied. The samples were allowed to cure for a period of at least 24 hours. The Series 22 Microtester by Dage measured the failure loads of approximately 10 samples from each wafer. Some samples were thrown out of the test results due to 2 reasons. In preparation of the epoxy it was necessary to mix equal parts of resin and adhesive. The method used was not quantitative and it appeared that one batch of mixture did not contain enough of one ingredient to allow the epoxy to set, causing little or no adhesion. The second reason was an excess amount of epoxy applied to the stud. Too much epoxy squeezed form underneath the stud causing a greater contact surface area and therefore the test on that sample was unacceptable.

ADHESION AND T TEST

The results of the stud pull test are shown in the Tables below. Both APTS and HMDS provided improved adhesion for each PTFE dispersion, with APTS providing better results than HMDS. A T-test was applied to all possible combinations within each PTFE dispersion.

TABLE 1

ADHESION TESTS OF D-2 AND T-30

| kg | lbs | psi | in² | S.dev | Ave(psi) | Sample |
|---|---|---|---|---|---|---|
| D-2 WITH NO ADHESION PROMOTER ||||||||
| 1.90 | 4.19 | 167.55 | 0.025 | 35.411 | 133.380 | 8 |
| 1.30 | 2.87 | 114.64 | | | | |
| 1.50 | 3.31 | 132.28 | | | | |
| 1.70 | 3.75 | 149.91 | | | | |
| 1.60 | 3.35 | 141.10 | | | | |
| 1.10 | 2.43 | 97.00 | | | | |
| 0.90 | 1.98 | 79.37 | | | | |
| 2.10 | 4.63 | 185.19 | | | | |
| D-2 APTS ||||||||
| 1.90 | 4.19 | 167.55 | 0.025 | 56.885 | 247.898 | 8 |
| 2.10 | 4.63 | 185.19 | | | | |
| 2.80 | 6.17 | 246.92 | | | | |
| 2.80 | 6.17 | 246.92 | | | | |
| 3.60 | 7.94 | 317.47 | | | | |
| 3.50 | 7.72 | 308.65 | | | | |
| 2.70 | 5.95 | 238.10 | | | | |
| 2.30 | 5.07 | 202.83 | | | | |
| 3.60 | 7.94 | 317.47 | | | | |
| D-2 HMDS ||||||||
| 2.20 | 4.85 | 194.01 | 0.025 | 53.277 | 163.142 | 10 |
| 0.80 | 1.76 | 70.55 | | | | |
| 0.70 | 1.54 | 61.73 | | | | |
| 2.20 | 4.85 | 194.01 | | | | |
| 2.00 | 4.41 | 176.37 | | | | |
| 2.00 | 4.41 | 176.37 | | | | |
| 2.20 | 4.85 | 194.01 | | | | |
| 2.00 | 4.41 | 176.37 | | | | |
| 1.90 | 4.19 | 167.55 | | | | |
| 2.50 | 5.51 | 220.46 | | | | |
| T-30 NO ADHESION PROMOTER ||||||||
| 0.30 | 0.68 | 26.46 | 0.025 | 35.548 | 70.548 | 9 |
| 1.00 | 2.20 | 88.18 | | | | |
| 0.50 | 1.10 | 44.09 | | | | |
| 0.40 | 0.88 | 35.27 | | | | |
| 1.00 | 2.20 | 88.18 | | | | |
| 1.60 | 3.53 | 141.10 | | | | |
| 1.00 | 2.20 | 88.18 | | | | |
| 0.80 | 1.76 | 70.55 | | | | |
| 0.60 | 1.32 | 52.91 | | | | |
| T-30 APTS ||||||||
| 3.80 | 8.38 | 335.10 | 0.025 | 68.459 | 338.630 | 10 |
| 2.50 | 5.51 | 220.46 | | | | |
| 4.60 | 10.14 | 405.65 | | | | |
| 3.00 | 6.61 | 264.55 | | | | |
| 3.50 | 7.72 | 308.65 | | | | |

TABLE 1-continued

| kg | lbs | psi | in² | S.dev | Ave(psi) | Sample |
|---|---|---|---|---|---|---|
| 3.60 | 7.94 | 317.47 | | | | |
| 3.60 | 7.94 | 317.47 | | | | |
| 4.90 | 10.80 | 432.11 | | | | |
| 4.10 | 9.04 | 361.56 | | | | |
| 4.80 | 10.58 | 423.29 | | | | |
| T-30 HMDS ||||||||
| 1.80 | 3.97 | 158.73 | 0.025 | 85.425 | 221.565 | 8 |
| 3.70 | 8.16 | 326.28 | | | | |
| 2.20 | 4.85 | 194.01 | | | | |
| 2.10 | 4.63 | 185.19 | | | | |
| 1.40 | 3.09 | 123.46 | | | | |
| 2.00 | 4.41 | 176.37 | | | | |
| 2.70 | 5.95 | 238.10 | | | | |
| 4.20 | 9.26 | 370.38 | | | | |

T TESTS

| | none | APTS | HMDS |
|---|---|---|---|
| D-2 PTFE DISPERSION ||||
| none | | 13.552 | 15.577 |
| APTS | 5.039937 | | 16.485 |
| HMDS | 1.417914 | 3.341413 | D.O.F. |
| T-30 PTFE DISPERSION ||||
| none | | 13.806 | 9.132 |
| APTS | 22.62394 | | 13.308 |
| HMDS | 12.74457 | 3.87603 | D.O.F. |

| D-2 % certainty | | |
|---|---|---|
| None-APTS | 99.95% | The % certainty is the certainty that |
| None-HMDS | 99.95% | the two groups came from different APTS- |
| HMDS | 99.75% | distributions. |
| T30 | | |
| None-APTS | 99.95% | |
| None-HMDS | 99.95% | |
| APTS-HMDS | 99.80% | |

LEAKAGE CURRENT AND BREAKDOWN VOLTAGE

Aluminum was the metal chosen in this experiment and served as the bottom electrode, the mercury probe served as the top electrode. Four experimental wafers were sputtered with a 1 micron thick layer of aluminum.

The APTS was applied to the wafers using a spin coater. The wafers were spun for 10 seconds at 50 rpm to allow a manual dispense of the APTS. After being wetted thoroughly with the APTS, the wafers were spun for 30 seconds at 1000 rpm to remove all excess material and to allow the promoter solvent to evaporate. They were then passed onto a hot plate operating a temperature of 130° C. with direct contact for 60 seconds to allow curing of the APTS.

The two commercially available dispersions to be deposited were T-30 from DuPont and D-2 from Daiken. It was necessary to dilute the dispersions 1:2 with deionized water to achieve an appropriate film thickness of about 0.5 micron. The T-30 dispersion was deposited on two wafers and the D-2 dispersion was deposited on two other wafers. The PTFE was applied also using the spin coater. The four wafers were spun for 10 seconds at 50 rpm to allow a manual dispense of the PTFE. After being wetted thoroughly with the PTFE, the wafers were allowed to sit for 10 seconds. They were then spun for 45 seconds at 920 rpm to remove all excess material and to allow the water to evaporate. The wafers were then passed to a hot plate operating at a temperature of 250° C. and were allowed to preheat for 30 seconds at a setting of 20 steps above the hot plate and then direct contact for 60 seconds to bake off the surfactant. The wafers were then sintered by one of two procedures and the breakdown voltage and the leakage current were measured.

The sintering method was the variable in the aforementioned procedure. Two wafers (one from each PTFE dispersion) were sintered by following a first procedure and two wafers were sintered following a second procedure. The two procedures produced high and a low cooling rates.

The first procedure is a 390° C. contact sinter for 5 minutes and then the wafer is rapidly cooled to between about 13° C. and about 280° C., and preferably immediately quenched on a chill plate operating at a temperature of 13° C.

The second procedure gradually heats the wafer to about 390° C. in an oven and holds it at such temperature for about 1 hour. The wafer is then slowly cooled as the oven temperature lowers to ambient conditions.

The cooling rates of the two separate procedures were measured using the Supermole Gold temperature data acquisition device manufactured by ECD Corporation. To produce accurate measurements the thermocouples used must have a very high response time. The OMEGA CO2-K foil thermocouple by Omega Engineering was the thermocouple chosen in this procedure. The cement that binds the thermocouples must also have good thermal conductivity and be thermally stable at the operating temperature of the hot plate (~390° C.). The cement used in this experiment is OMEGA type CC high temperature cement. The resulting cooling rate for the quenched process was measured to be 700 degrees Celsius/sec, the cooling rate for the sintered process was measured to be less than 1 degree Celsius/sec.

The dielectric properties were measured with the aid of a Mercury Contact Probe by MSI Industries. The leakage current was measured by use of the Hewlett-Packard pico amp meter. A field strength of 20 V/micron was applied and the leakage current was allowed to settle. When a consistent reading was reached, the background leakage was subtracted from this value to achieve the true leakage current of the film. The breakdown voltages were measured by use of the Hipotronics Hipot Tester model H36B which allowed for a manual increase of the source voltage through the film. There was a point along this gradual increase in voltage where a large current suddenly was allowed across the film. The voltage where this is detected by the Hipot tester is the breakdown voltage of the film. Measurements were taken at four separate points in the wafer and averaged for the final comparison.

The leakage current and breakdown voltage measurements of the four wafers are as follows:

| Wafer # | Dispersion | 390°C. sinter |
|---|---|---|
| 1 | D-2 | oven *final |
| 2 | D-2 | Hot plate/quench |
| thickness at 0.5 microns | | |
| 3 | T-30 | oven |
| 4 | T-30 | Hot plate/quench |

LEAKAGE CURRENT AT FIELD STRENGTH OF 20 V/MICRON

| Wafer # | Leakage current |
|---|---|
| 1 | 4.6 pA |
| 2 | 3.7 pA |
| 3 | 9.4 pA |
| 4 | 7.7 pA |

BREAKDOWN VOLTAGE (4 MEASUREMENTS TAKEN AT DIFFERENT SPOTS IN WAFER

| Wafer # | Breakdown Voltage (V) | Mean (V) |
|---|---|---|
| 1 | 136, 145, 134, 144 | 139.8 |
| 2 | 355, 366, 307, 376 | 325.3 |
| 3 | 38.6, 54.9, 66.7, 52.4 | 54.3 |
| 4 | 175, 156, 186, 180 | 174.3 |

The above-mentioned data confirms that more rapid cooling rates produced a more desirable film. Because of the almost instantaneous cooling rate of the quench process, it can be assumed that the quench method is the most desirable scenario possible for use in preparation of PTFE thin films as the insulative material in integrated circuits.

Measuring the dielectric constant of thin films is difficult. More particularly, in many types of thin films, the dielectric constant is not isotropic, i.e., the dielectric constant is often lower through the thickness (z-axis) of the film than it is in-plane (xy-plane). Thus, while many reported values of low dielectric constant materials report only the through thickness result, it is the in-plane dielectric constant that is important for the application of an integrated circuit dielectric material. The xy-plane dielectric constant determines the line-to-line capacitance, which is the dominant component of capacitive delay in integrated circuits.

Typically, measurement of dielectric constant in the z-axis is performed through the use of a metal-insulator-metal (MIM) parallel plate capacitor structure. The dielectric constant is calculated by determining the capacitance of the MIM structure. For the dielectric constant to be calculated accurately, it is important that both the area of the MIM and the insulator thickness be known. Often, it is difficult to determine the precise thickness of the insulated layer. Additionally, another common technique employed to measure dielectric constant in the z-axis uses a liquid mercury probe as the upper metal surface. Use of the mercury probe is simple; however, its use is complicated by the fact that the actual mercury probe contact area is not well known. It can vary greatly since the mercury has an extremely high surface tension and does not reproducibly wet the same surface with the same contact area.

At times, the dielectric constant of material is reported as a simple square of the material's index of refraction. This type of dielectric constant measurement permits calculation of dielectric constant both in the xy-plane and the z-axis of a thin film. However, such a dielectric constant measurement is determined at optical frequencies which is significantly different from the dielectric constant of the material at typical frequencies used in electronic signal propagation. As is well known, measurement of the dielectric constant by the simple square of the index of refraction typically understates the dielectric constant by an amount equal to approximately 0.2.

The following method may be employed to determine the xy-plane dielectric constant of an integrated circuit dielectric element of the present invention.

A base substrate, such as silicon or a silicon dioxide, is metallized typically with aluminum or copper by sputtering, MOCVD, or electroplating. The metallized substrate is then coated with a dielectric material. A typical coating thickness is approximately 1 micron, although other thicknesses can be used provided they do not demonstrate a change in critical properties, such as isotropy. A small portion of the metallized substrate is masked off prior to dielectric deposition to permit contacting the metallized substrate surface during testing. Following deposition of the dielectric layer, another metallic layer with a simple pattern is deposited on top of the dielectric material. A 1 cm×1 cm square pattern is masked on the dielectric material through the use of a tape such as polyimide tape. Once the 1 cm×1 cm area is defined with the tape, the substrate is then metallized again with a similar process such as sputtering or MOCVD or electroplating.

After metallization, the polyamid tape is removed from the dielectric in order to leave behind a 1 cm×1 cm metallization on the top surface of the wafer. The capacitance between the 1 cm×1 cm top layer of metal on the base substrate is then measured through the use of an instrument such as a Hewlett-Packard Model 4284 LCR meter. The precise film thickness is then determined by a scanning electron microscopy cross-section photomicrograph, unless other more accurate and verified methods can be shown for the dielectric material being tested. The dielectric constant is then calculated from the measured capacitance and thickness of the sample. This determines the dielectric constant in the z-axis.

Next, the xy-plane and z-axis index of refraction is measured through the use of a prism coupler, such as that manufactured by Metrocon, Inc. The index of refraction in the z-xis and the xy-plane are then both squared. The squared number for the xy-plane index of refraction is then subtracted from the square of the index of refraction for the z-axis. This difference is then subtracted from the previously calculated value for the dielectric constant of the z-axis direction to determine the dielectric constant of the xy-plane.

Figure 4:
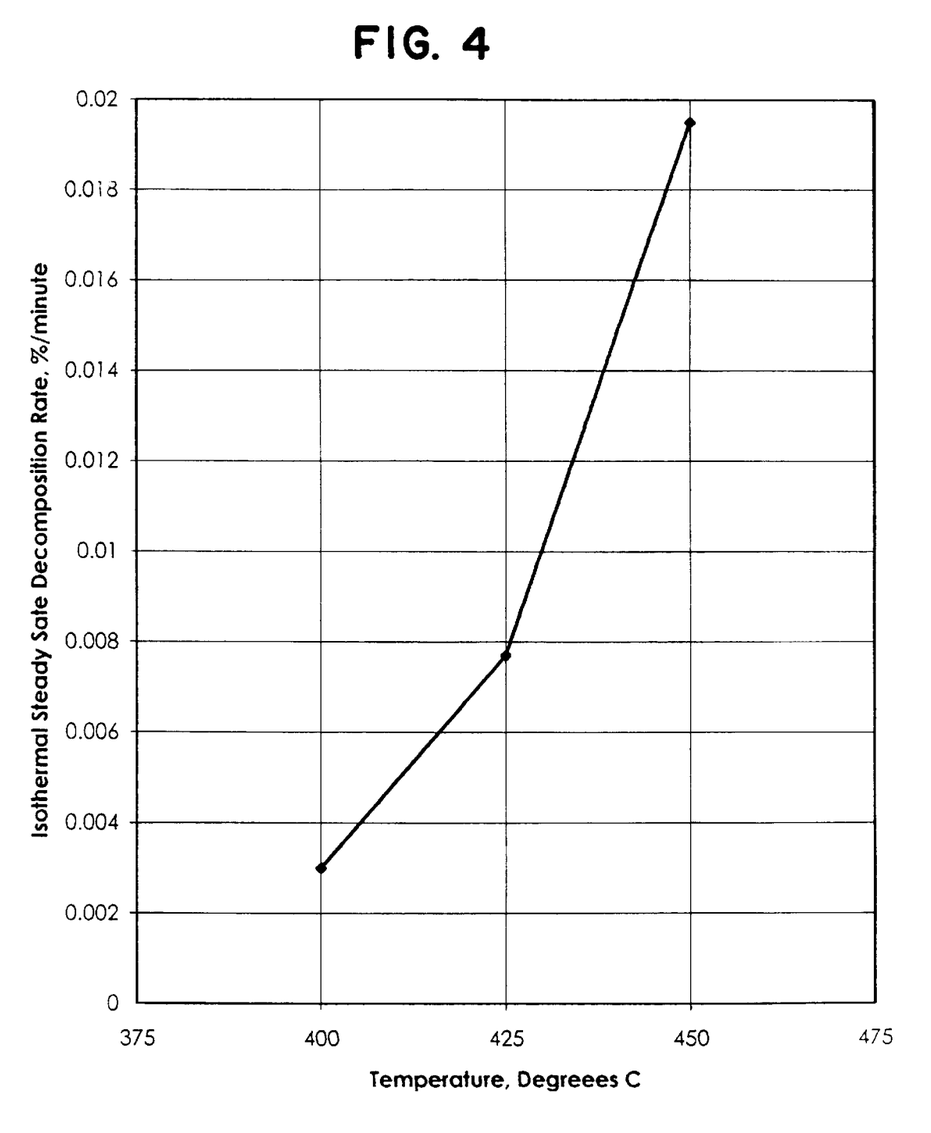
FIG. 4 is a graph of Isothermal Weight Loss Rate (%/minute) v. Temperature.

Thermal decomposition, as illustrated in FIG. 4, may be determined using any suitable conventional method. For example, thermal decomposition rate may be determined using a thermo-gravimetric analyzer (TGA) Model 2950 from TA Instruments, Inc. (New Castle, Del.). A 50 mL sample of the microemulsion is placed in the 100 mL sample pan of the TGA. The sample pan is tared by the TGA prior to sample introduction. The majority of the solvent is allowed to evaporate at room temperature. This requires about two hours. Alternatively, the sample drying can be accelerated by placing the sample pan on a hot plate controlled at 80 to 90° C. to avoid spattering the sample out of the pan by evaporating the liquid too rapidly. The sample and pan are cooled to room temperature. The sample is loaded into the TGA. (The instrument automatically hangs the pan from the hang-down wire of the balance.) The furnace is closed and the thermal method is started. The furnace and balance chamber are purged with dry nitrogen gas for at least two hours prior to running the first sample. The purge rate through the furnace is 60 mL/min and the balance chamber is 40 mL/min. It is important that both nitrogen purges be dried by passing the nitrogen gas though a Drierite® column prior to entering the TGA. (Drierite® is a registered trademark of W.A. Hammond Drierite Company.) As should be understood, nitrogen gas which has been taken from the boil-off of a liquid nitrogen tank is not dry enough for this test. It must still be passed through the Drierite® column prior to entering the TGA. The thermal method consists of: 1) heating the sample at 7.50° C./min, resolution =4.0, to 250° C.; 2) holding isothermal at 250° C. for 30 mins; 3) heating at 7.5° C./min, resolution =4.0, to 400° C.; and 4) holding isothermal at 400° C. for 120 mins. The data is analyzed by plotting only the last isotherm of the method as percent weight on the Y-axis and time (in minutes) on the X-axis. The percent weight at the start of this isothermal is adjusted to be 100 percent. This corrects for any residual solvent that may have been left in the sample after the initial drying step. Determining the curve value at the end of the isothermal curve (point 1) and sixty minutes prior to the end of the curve (point 2). Subtract the percent weight of point 1 from point 2 to obtain the percent weight loss per hour.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. An insulative material, comprising:
  at least one fluoropolymer layer having a weight loss of less than 0.1 5%/minute at 420° C, a thickness of less than 5$\mu$, and a breakdown field strength greater than 2.0 MV/cm, wherein said fluoropolymer laver is comprised at least in part of a homopolymer of tetrafluoroethylene or a copolymer of tetrafluoroethylene.

2. The insulative material according to claim 1, wherein the fluoropolymer layer has a dielectric constant in a range from about 1.3 to about 2.2.

3. The insulative material according to claim 1, wherein the fluoropolymer layer thickness is less than 1 .5$\mu$.

4. The insulative material according to claim 1, wherein the weight loss is less than 0.02%/minute at 420° C.

5. The insulative material according to claim 1, wherein the weight loss is less than 0.01 %/minute at 420° C.

6. The insulative material according to claim 1, wherein the copolymer includes, as comonomer, hexafluoropropylene or perfluoro (alkyl vinyl ether).

7. The insulative material of claim 1, wherein the fluoropolymer layer further includes silicon dioxide.

* * * * *